US012607654B2

(12) United States Patent
Gao et al.

(10) Patent No.: US 12,607,654 B2
(45) Date of Patent: Apr. 21, 2026

(54) SYSTEM AND METHOD FOR IN-SITU MAPPING ON ELECTRODE POTENTIAL AND THERMAL DISTRIBUTION

(71) Applicant: GM GLOBAL TECHNOLOGY OPERATIONS LLC, Detroit, MI (US)

(72) Inventors: Jing Gao, Rochester, MI (US); Brian J. Koch, Berkley, MI (US); Taylor R. Garrick, Bloomfield Hills, MI (US); Wei Zeng, Oakland Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 715 days.

(21) Appl. No.: 17/891,120

(22) Filed: Aug. 18, 2022

(65) Prior Publication Data

US 2024/0061023 A1 Feb. 22, 2024

(51) Int. Cl.
*G01R 19/00* (2006.01)
*H04N 5/33* (2023.01)

(52) U.S. Cl.
CPC .......... *G01R 19/0046* (2013.01); *H04N 5/33* (2013.01)

(58) Field of Classification Search
CPC .. G01R 19/0046; G01R 31/36; G01R 31/367; G01R 31/388; G01R 31/389; H04N 5/33
See application file for complete search history.

(56) References Cited

U.S. PATENT DOCUMENTS

| | | | |
|---|---|---|---|
| 6,275,004 B1 | 8/2001 | Tamai et al. | |
| 7,851,085 B2 | 12/2010 | Obrovac et al. | |

| | | | |
|---|---|---|---|
| 8,565,949 B2 | 10/2013 | Christman et al. | |
| 8,586,222 B2 | 11/2013 | Timmons et al. | |
| 9,028,565 B2 | 5/2015 | Huang | |
| 9,142,830 B2 | 9/2015 | Xiao et al. | |
| 9,142,980 B2 | 9/2015 | Lee | |
| 9,281,514 B2 | 3/2016 | Rhodes et al. | |
| 9,379,418 B2 | 6/2016 | Wang et al. | |
| 9,660,462 B2 | 5/2017 | Jeon | |
| 9,923,189 B2 | 3/2018 | Xiao | |
| 10,062,898 B2 | 8/2018 | Xiao | |
| 10,199,643 B2 | 2/2019 | Zhou et al. | |
| 10,367,201 B2 | 7/2019 | Yang et al. | |
| 10,388,959 B2 | 8/2019 | Dong et al. | |
| 10,424,784 B2 | 9/2019 | Yang et al. | |
| 10,435,773 B2 | 10/2019 | Liu et al. | |
| 10,446,884 B2 | 10/2019 | Yang et al. | |
| 10,511,049 B2 | 12/2019 | Yang et al. | |

(Continued)

FOREIGN PATENT DOCUMENTS

| | | | |
|---|---|---|---|
| JP | 2012079582 A | | 4/2012 |
| JP | 2016146247 A | * | 8/2016 |

*Primary Examiner* — Catherine T. Rastovski
*Assistant Examiner* — Yossef Korang-Beheshti
(74) *Attorney, Agent, or Firm* — Quinn IP Law

(57) ABSTRACT

A system for in-situ mapping of electrode potential and thermal distribution is provided. The system includes a test device. The test device includes an anode, a cathode, a reference electrode, a separator disposed between the anode and the cathode, and a voltage potential sensor configured for monitoring a voltage potential at a first position upon one of the anode or the cathode as compared to a voltage potential of the reference electrode. The system further includes an infrared sensor device configured for collecting data describing temperature variation across a surface of one of the anode or the cathode.

18 Claims, 4 Drawing Sheets

(56)        References Cited

U.S. PATENT DOCUMENTS

| | | | |
|---|---|---|---|
| 10,566,652 B2 | 2/2020 | Dai et al. | |
| 10,573,879 B2 | 2/2020 | Yang et al. | |
| 10,593,988 B2 | 3/2020 | Xiao et al. | |
| 10,629,941 B2 | 4/2020 | Dai et al. | |
| 10,637,048 B2 | 4/2020 | Qi et al. | |
| 10,673,046 B2 | 6/2020 | Dadheech et al. | |
| 2007/0218329 A1* | 9/2007 | Keith | H01M 8/04007 |
| | | | 429/442 |
| 2009/0104510 A1 | 4/2009 | Fulop et al. | |
| 2010/0009250 A1* | 1/2010 | Nakamura | H01M 4/13 |
| | | | 429/152 |
| 2011/0215767 A1 | 9/2011 | Johnson et al. | |
| 2011/0248675 A1 | 10/2011 | Shiu et al. | |
| 2012/0206296 A1 | 8/2012 | Wan | |
| 2013/0119935 A1 | 5/2013 | Sufrin-Disler et al. | |
| 2014/0152232 A1 | 6/2014 | Johnson et al. | |
| 2014/0299770 A1* | 10/2014 | Giebeler | G01J 5/10 |
| | | | 427/124 |
| 2015/0147614 A1* | 5/2015 | Wang | G01R 31/3835 |
| | | | 429/93 |
| 2018/0151922 A1 | 5/2018 | Ito et al. | |
| 2018/0321325 A1* | 11/2018 | Fortier | H01M 10/48 |
| 2019/0041464 A1* | 2/2019 | Chow | G01R 31/392 |
| 2019/0044097 A1* | 2/2019 | Yu | H01M 50/46 |
| 2019/0280333 A1 | 9/2019 | Dahn et al. | |
| 2019/0280334 A1 | 9/2019 | Dahn et al. | |
| 2019/0393546 A1 | 12/2019 | Dahn et al. | |
| 2021/0057786 A1* | 2/2021 | Tomar | H01M 4/525 |
| 2021/0091369 A1 | 3/2021 | Dadheech et al. | |
| 2021/0091424 A1 | 3/2021 | Gao et al. | |
| 2021/0218006 A1 | 7/2021 | Gao et al. | |
| 2023/0091154 A1 | 3/2023 | Gao | |

* cited by examiner

SYSTEM AND METHOD FOR IN-SITU MAPPING ON ELECTRODE POTENTIAL AND THERMAL DISTRIBUTION

INTRODUCTION

The disclosure generally relates to a system and method for in-situ mapping of electrode potential and thermal distribution.

A battery cell or a battery includes an anode electrode, a cathode electrode, a separator, and an electrolyte. An electrode has a potential or voltage potential as compared to a reference value. The electrode may have variable potential at different locations on the electrode.

Heat is generated in a battery when the battery either is in a charging cycle or a discharging cycle. An electrode may have variable temperature at different locations on the electrode.

SUMMARY

A system for in-situ mapping of electrode potential and thermal distribution is provided. The system includes a test device. The test device includes an anode, a cathode, a reference electrode, a separator disposed between the anode and the cathode, and a voltage potential sensor configured for monitoring a first voltage potential at a first position upon one of the anode or the cathode as compared to a second voltage potential of the reference electrode. The system further includes an infrared sensor device configured for collecting data describing temperature variation across a surface of one of the anode or the cathode.

In some embodiments, the test device further includes an infrared transparent wall configured for enabling the infrared sensor device to collect the data describing the temperature variation.

In some embodiments, the infrared transparent wall is constructed with sapphire or calcium fluoride.

In some embodiments, the test device further includes at least one temperature sensor configured for monitoring a temperature at a second position upon one of the anode or the cathode and is configured for calibrating the infrared sensor device.

In some embodiments, the test device further includes a plurality of voltage potential sensors configured for monitoring a voltage potential variation within one of the anode and the cathode and a plurality of temperature sensors.

In some embodiments, the infrared sensor device is configured for generating a two-dimensional output describing the temperature variation.

In some embodiments, the two-dimensional output includes a spectral display providing a visual representation of the temperature variation.

In some embodiments, the test device further includes a pressure sensor providing data regarding a pressure within the test device.

In some embodiments, the reference electrode is located within the separator.

In some embodiments, the test device further includes a spring device useful to apply a compressive pressure upon the anode, the cathode, the reference electrode, and the separator.

In some embodiments, the system further includes a power source configured for providing a desired anode electrical charge to the anode and a desired cathode electrical charge to the cathode.

In some embodiments, the system further includes a computerized device. The computerized device includes programming to monitor data generated by the voltage potential sensor and monitor data generated by the infrared sensor device. The computerized device further includes programming to control operation of a test cycle including controlling operation of the anode and the cathode through the test cycle and analyze the monitored data generated by the voltage potential sensor and the infrared sensor device during the test cycle to provide correlated voltage potential distribution data and temperature distribution data across the surface of the one of the anode and the cathode.

In some embodiments, the data generated by the voltage potential sensor and the data generated by the infrared sensor device are simultaneously collected.

According to one alternative embodiment, a system for in-situ mapping of electrode potential and thermal distribution is provided. The system includes a test device. The test device includes an anode, a cathode, and a reference electrode. The test device further includes a separator disposed between the anode and the cathode, a plurality of voltage potential sensors configured for monitoring a first voltage potential distribution within one of the anode or the cathode as compared to a second voltage potential of the reference electrode, and a plurality of temperature sensors. The test device further includes a pressure sensor providing data regarding a pressure within the test device and an infrared transparent wall. The system further includes an infrared sensor device configured for collecting data describing temperature variation across one of the anode or the cathode through the infrared transparent wall, wherein the plurality of temperature sensors are configured for calibrating the infrared sensor device.

In some embodiments, the infrared sensor device is configured for generating a two-dimensional output describing the temperature variation.

In some embodiments, the two-dimensional output includes a spectral display providing a visual representation of the temperature variation.

In some embodiments, the system further includes a computerized device including programming to monitor data generated by the plurality of voltage potential sensors, monitor data generated by the plurality of temperature sensors, monitor data generated by the pressure sensor, and monitor data generated by the infrared sensor device. The computerized device further includes programming to control operation of a test cycle including controlling operation of the anode and the cathode through the test cycle and analyze the monitored data generated by the plurality of voltage potential sensors, the plurality of temperature sensors, the pressure sensor, and the infrared sensor device during the test cycle to provide correlated voltage potential distribution data and temperature distribution data across the surface of the one of the anode and the cathode.

According to one alternative embodiment, a method for in-situ mapping of electrode potential and thermal distribution is provided. The method includes operating a test device including an anode, a cathode, a separator, a reference electrode, and a plurality of voltage potential sensors disposed to provide data regarding voltage potential distribution within the anode or the cathode. The method further includes operating an infrared sensor device to provide data regarding a temperature distribution across a surface of one of the anode or the cathode. The method further includes operating a test cycle including controlling operation of the anode and the cathode to generate potential distribution and temperature distribution within the test device. The method further includes analyzing the data regarding the voltage potential distribution and the data regarding the temperature distribution collected during the test cycle. The method further includes configuring an electrode for manufacture based upon the analyzing.

The above features and advantages and other features and advantages of the present disclosure are readily apparent from the following detailed description of the best modes for carrying out the disclosure when taken in connection with the accompanying drawings.

DETAILED DESCRIPTION

Figure 1:
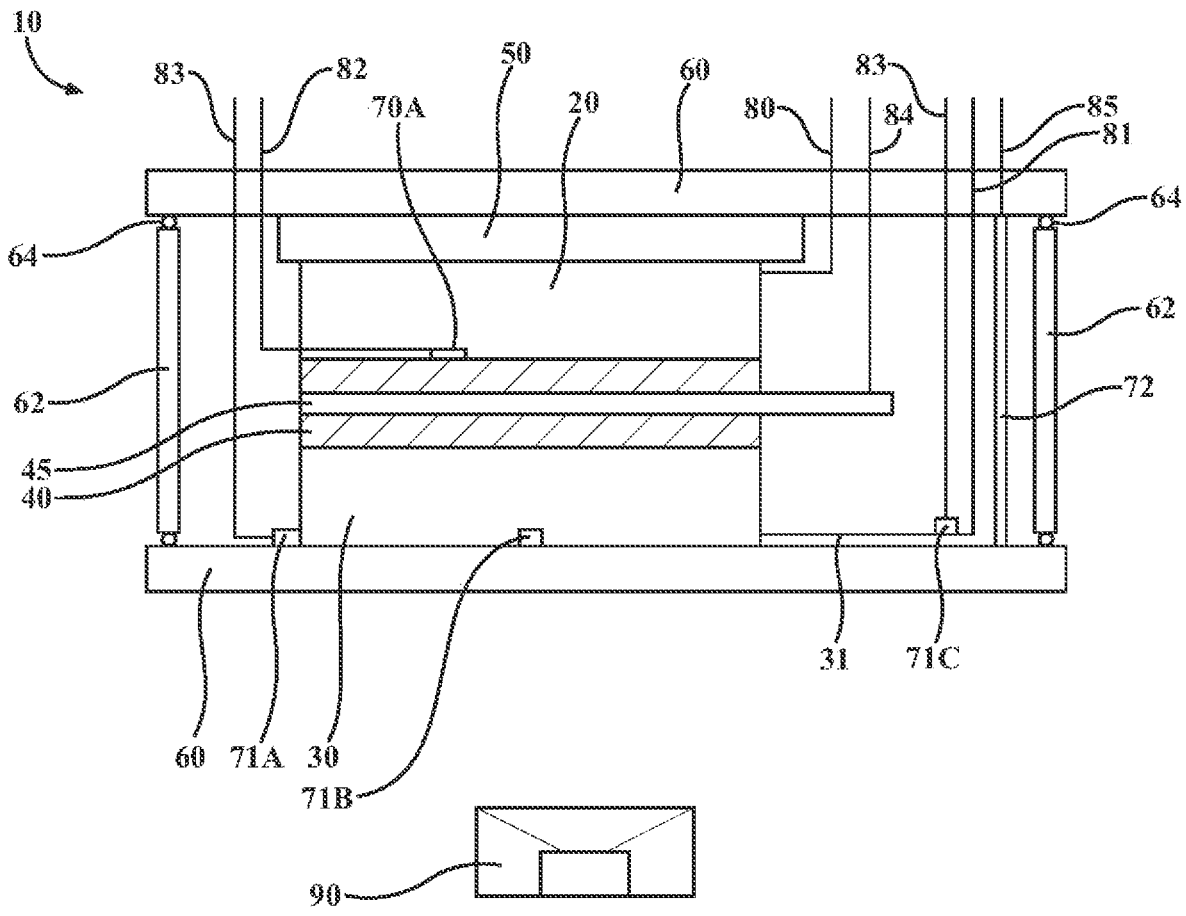
FIG. 1 schematically illustrates in a first view an exemplary test device useful for in-situ mapping of electrode potential and thermal distribution, in accordance with the present disclosure.

A system and method for in-situ methodology for mapping both electrode potential distribution and thermal distribution in a battery cell reaction. The system includes a test device including an operating or simulated battery or battery cell. The battery includes an electrode to be mapped. Sensors are utilized to map conditions upon the electrode to be mapped such that precise and detailed information about the electrode may be monitored. In one embodiment, the test device includes a porous reference electrode and porous conductive wires coated on a separator, which can be placed inside a cell stack with minimized influence on cell operation. The disclosed system and method provide integral electrode potential-thermal mapping to collect coinstantaneous signal of the potential distribution and the thermal distribution. The coinstantaneous signal may be utilized to provide physical-based data or data providing real-world information useful to fine tune operation of the electrode. In one example, with the disclosed method, the potential at a location with a calibrated temperature may be determined. One may analyze the potential at a location with a lowest temperature or at a location with a highest temperature. This potential information correlated with the temperature data may be useful to determine a weak point on the electrode and to refine lithium plating at the weak point location. The data may be used in other ways, for example, to calibrate other computer models to more accurate data sets and to refine battery cooling strategies.

Fixed to the one side of the separator is an electrically conductive reference electrode, which may be coterminous in area with the major face of the separator to which the reference electrode is mounted. A reference electrode current collector may be sandwiched between the reference electrode and separator for electrically connecting the reference electrode to the voltage sensors. The voltage sensing leads and reference electrode cooperatively transmit electrical signals to the voltage sensors to determine electrode voltages at various locations on a single electrode. Optionally, the same reference electrode may operatively connect with one or more voltage sensing leads located at different layers throughout the stack to take voltage sensor readings at select regions of multiple electrodes.

The reference electrode may be fabricated as a unitary, single-piece construction that is formed, in whole or in part, from an electroactive and conductive material that is innately porous or fashioned with a predefined minimum porosity. The reference electrode may have a surface area that is substantially coterminous with the surface area of the separator to which it attaches. For at least some implementations, the reference electrode is formed as an electrically conductive and ionically permeable electrode film with a reference electrode thickness of about 0.02 micrometers ($\mu$m) to about 10.0 $\mu$m. Each electrical sensing lead may be formed as an electrically conductive and ionically permeable pad with a lead thickness of approximately 0.01 $\mu$m to about 1.0 $\mu$m. Similar to the separator, reference electrode, and current collector, the sensing leads are innately porous or fashioned with a predefined minimum porosity.

The disclosed system and method provide detailed and precise information about operation of the electrode under various conditions. This detailed and precise information may be useful to refining cell operation protocol, for example, designing an excellent electrode for large scale manufacture based upon the information regarding the test device and the electrode to be mapped. For example, the detailed and precise information about electrode potential and temperature may be used to generate a more accurate direct current fast charging (DCFC) lithium plating boundary for a cell with large thermal variation.

One or more sensors are utilized to map electrode potential distribution upon the electrode. The electrode distribution map is collected by a reference electrode and several potential reading sensors at different locations. The reference electrode may be a separator-based thin film layer sensor insulated from the electrode by a separator. The potential reading sensors are conductive thin coating on either the other side of the reference electrode substrate or on an additional separator. The potential reading sensors may have selective pattern and size on sensing area to achieve a desired signal/noise ratio. The potential sensing area location may be determined by a pre-simulation result or based on data in need for cell pack design.

One or more sensors are utilized within or in correlation with the test device to map temperature upon the electrode. In one embodiment, the thermal distribution map is collected by infrared high-resolution thermography. The battery cell may be placed and sealed in an infrared transparent cell fixture, thorough which the cell thermal distribution can be collected by an infrared detector. The test device may have one or more infrared transparent surfaces. The test device may include porous reference electrode and porous potential reading wires placed inside the stack between the cathode and anode, which is further sandwiched in the transparent cell fixture.

The test device may include a device useful to collect infrared high-resolution thermography, and the test device may additionally include one or more thermal sensors at selective locations for additional thermal readings or for calibrating thermal mapping. Those thermal sensors may be located on the non-reaction side of electrode or at an out-of-stack area to avoid disturbing cell operation.

The test device may have a compression component on one side of the fixture to apply designed compression upon the battery cell. The test device may include one or more pressure sensors, e.g., piezoelectric material or pressure paper, at selective locations for measuring pressure or calibrating applied pressure. The pressure sensors may be located on the non-reaction side of the electrode or at an out-of-stack area to avoid disturbing cell operation.

The testing cell fixture may have connections for a cathode electrode, an anode electrode, the reference electrode, and for each potential reading sensor. The connections may be provided for connection to external equipment for electrochemical control and sensing.

During a test event, an electrochemical reaction within the battery cell is controlled by external equipment with current, or voltage, or a combination of both. The potential map is collected with the reference electrode and the potential sensors. The thermal signal is collected by infrared detector. The test device may include a heating device, a cooling device, or other heating and cooling resource such as a flow of coolant liquid through a heat exchanger device on the edge or surface of the test device to create selective thermal ambience.

The coinstantaneous detection of the potential distribution and the thermal distribution can support refining cell operation protocol, such as generating a more accurate DCFC lithium plating boundary for a cell with large thermal variation.

The disclosed method provides in-situ component-level potential-thermal integral mapping on an operating battery cell. The disclosed method includes in-stack electrode potential reading at various locations on electrode surface and advanced thermal imaging to map thermal distribution. The disclosed method includes physical-based in-situ data collection and evaluation of a correlation between electrode potential and thermal variation. The disclosed method may be utilized to achieve control and feedback on both electrode potential and thermal properties.

The potential signal and the thermal signal are signal monitored as results of the described test. The potential signal and the thermal signal may additionally be used as inputs for controlling the electrochemical reaction.

Referring now to the drawings, wherein like reference numbers refer to like features throughout the several views, FIG. 1 schematically illustrates in a first view an exemplary test device 10 useful for in-situ mapping of electrode potential and thermal distribution and including an anode 30, a cathode 20, and a separator 40. An infrared sensor device 90 is illustrated configured for sensing a temperature across a surface of the anode 30. The test device 10 further includes a reference electrode 45. The test device 10 further includes a plurality of infrared transparent walls 60 or windows. In one embodiment, one of the walls may be infrared transparent, with the wall not facing the infrared sensor device 90 not being transparent. The separator 40 enables ion transfer between the anode 30 and the cathode 20 and prevents physical contact between the anode 30 and the cathode 20.

The infrared transparent walls 60 may be constructed with a material that permits infrared radiation to pass freely through and which is inert to the electrodes disposed adjacent thereto. Exemplary materials to construct the infrared transparent walls 60 include but are not limited to sapphire and calcium fluoride.

The test device 10 is further illustrated including sealing end caps 62 including O-ring seals 64. The test device 10 including the infrared transparent walls 60, adjoining walls of other parts or sides of the test device 10, and the sealing end caps 62 may be a sealed container and may be configured for maintaining a desired pressure within the test device 10. The test device 10 is further illustrated including a compression spring device 50 configured for providing a desired compression force upon the anode 30, the cathode 20, and the separator 40. A cathode connection 80 is illustrated, and an anode connection 81 is illustrated. Electrical energy may be channeled through the cathode connection 80 and the anode connection 81, either through electrochemical processes within the test device 10 and/or by connection to an exterior power source, to simulate operation of a battery modeled by the test device 10.

The device 10 is illustrated including a plurality of sensors. A potential sensor 70A is illustrated disposed upon the cathode 20. Additional potential sensors may be disposed at various locations upon the anode 30 and the cathode 20. The reference electrode 45 disposed within the separator 40 may be utilized as a comparator with the potential sensor 70A, and with a reading from a reference electrode connection 84 providing a reference potential to compare readings of the potential sensor 70A against. A plurality of potential sensors 70A may be utilized at various positions around the anode 30 and the cathode 20.

The infrared sensor device 90 may be an infrared camera or a similar device useful to collect data across a two-dimensional surface. The infrared sensor device 90 may provide detailed thermal data regarding temperature variation across a surface of one of the anode 30 and the cathode 20. In one embodiment, the infrared sensor device 90 may generate an output including a spectral display providing a visual representation of varying temperatures across a surface of an object such as a rectangular electrode.

A plurality of temperature sensors 71A and 71B are illustrated, disposed upon or adjacent to the anode 30 to measure temperatures at various locations upon the anode 30. A temperature sensor 71C is illustrated disposed upon an anode current collector 31. In one embodiment, the temperature sensors 71A, 71B, and 71C may be optional to the disclosed device 10. The infrared sensor device 90 may include a calibration error, for example, including an absolute offset error or a gradient offset error as compared to actual temperatures upon the electrode being analyzed. The temperature sensors 71A, 71B, and 71C may be used to correct or minimize calibration errors of the infrared sensor device 90. In one embodiment, the temperature sensors 71A, 71B, and 71C provide calibration of the infrared sensor device 90 integrated into the process of collecting data from the device 10. In another embodiment, the temperature sensors 71A, 71B, and 71C may be omitted from device 10, and the infrared sensor device 90 may be calibrated separately. For increased resolution, more temperatures sensors may be utilized in addition to temperature sensors 71A, 71B, and 71C.

The infrared sensor device 90 may be utilized to evaluate and map temperature differences upon either the anode 30 or the cathode 20. Data from the temperature sensors 71A, 71B, and 71C may be utilized to calibrate or improve accuracy of data from the infrared sensor device 90.

Pressure sensor 72 may be utilized to evaluate a pressure within the test device 10. The pressure within the test device 10 may influence operation of the anode 30 and the cathode 20 and may be a factor to track in evaluating operation of the test device 10.

A plurality of additional connections 82, 83, 84, and 85 are present. One or more of the connections 82 are used to connect the potential sensor(s) 70A to a computerized device useful to collect data from the test device 10. One or more of the connections 83 are used to connect the temperature sensor(s) 71A, 71B, and 71C to the computerized device useful to collect data from the test device 10. The reference electrode connection 84 is useful to control a potential of the reference electrode 45. The connection 85 is used to connect the pressure sensor 72 to the computerized device useful to collect data from the test device 10.

The anode 30 is illustrated disposed against or next to one of the infrared transparent walls 60 such that the infrared sensor device 90 may acquire data regarding temperature distribution around the surface of the anode 30. In another embodiment, the locations of the anode 30 and the cathode 20 may be reversed, such that the cathode 20 is disposed next to the infrared transparent wall 60.

Figure 2:
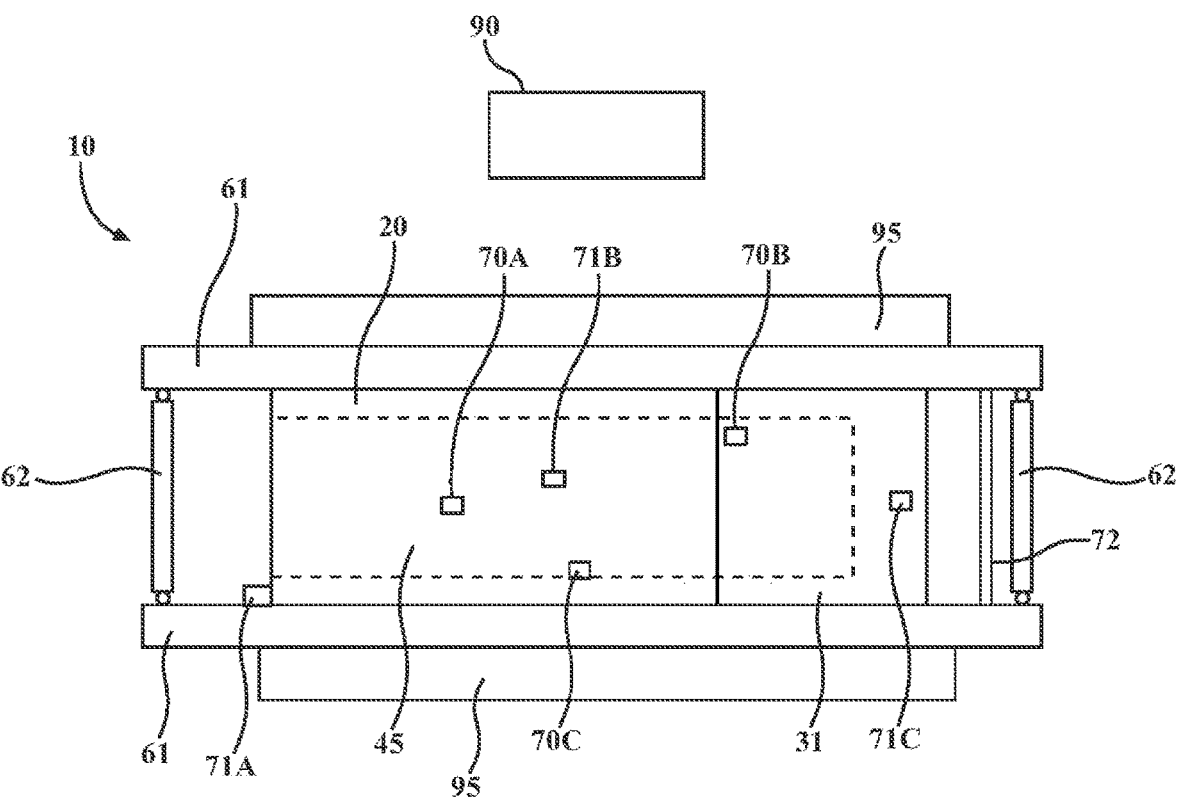
FIG. 2 schematically illustrates the test device of FIG. 1 in a second view offset ninety degrees from the first view of FIG. 1, in accordance with the present disclosure.

FIG. 2 schematically illustrates the test device 10 of FIG. 1 in a second view offset ninety degrees from the first view of FIG. 1. The test device 10 is illustrated including the anode 30 and the anode current collector 31, the reference electrode 45 (represented by dotted lines), side walls 61 and the sealing end caps 62. The infrared sensor device 90 is illustrated closer to the viewer of FIG. 2 than the test device 10, disposed to collect infrared data from the anode 30 visible through the infrared transparent walls 60 of FIG. 1.

The test device 10 is further illustrated including a plurality of potential sensors 70A, 70B, and 70C. The potential sensors 70A, 70B, and 70C may be disposed upon the anode 30 or the cathode 20 of FIG. 1 and are useful to monitor voltage potential of the one of the anode 30 or the cathode 20 at various locations. The test device 10 is further illustrated including the temperature sensors 71A, 71B, and 71C and including the pressure sensor 72.

The test device 10 is further illustrated including one or more temperature control devices 95 disposed along one or more sides of the test device 10. The temperature control devices 95 may include an electrical resistance coil useful to generate heat. The temperature control devices 95 may include coolant or a refrigerant loop configured to remove heat from the test device 10 or to provide coolant or refrigerant at a desired temperature alongside the test device 10.

Figure 3:
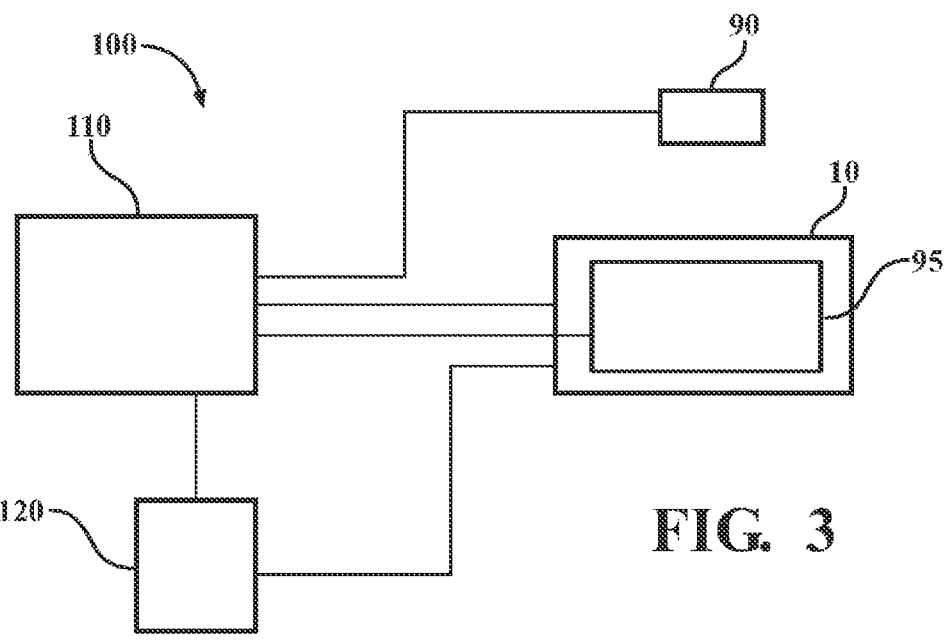
FIG. 3 schematically illustrates a system including the test device of FIG. 1, in accordance with the present disclosure.

FIG. 3 schematically illustrates a system 100 including the test device 10 of FIG. 1. The system 100 is illustrated including a computerized device 110 including a processor configured for operating computerized programming and is useful for operating the disclosed method in the test device 10. The system 100 is further illustrated including a power source 120, which may be useful to receive power from an infrastructure source, such as a 120 Volts alternating current wall socket and provide power to the test device 10 and the temperature control device 95, for example, in a form of electrical power at 12 Volts direct current. The power source 120 may be configured for providing a desired anode electrical charge to the anode 30 of the test device 10 and for providing a desired cathode electrical charge to the cathode 20 of the test device 10. The electrical charges provided by the power source 120 may be used to simulate particular charging or discharging of a battery cell simulated by the test device 10. The temperature control device 95 is further illustrated. The temperature control device 95 is illustrated as a box situated upon or next to the test device 10 for simplicity sake. The temperature control device 95 may include machinery useful to create and manage a flow of coolant or refrigerant at a desired temperature and is illustrated in electronic communication with the computerized device 110. The infrared sensor device 90 is further illustrated in electronic communication with the computerized device 110 and is disposed in a position to generate data regarding an electrode within the test device 10 through an infrared transparent wall 60 of the test device 10.

Figure 4:
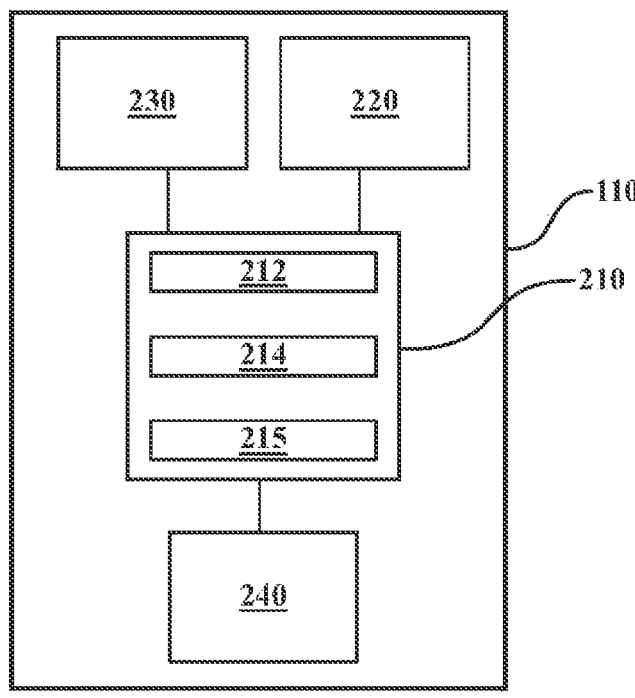
FIG. 4 schematically illustrates an exemplary computerized device configured for operating the disclosed method, in accordance with the present disclosure.

FIG. 4 schematically illustrates an exemplary computerized device 110 configured for operating the disclosed method. Computerized device 110 includes processing device 210, communications device 220, data input output device 230, and memory storage device 240. It is noted that computerized device 110 may include other components and some of the components are not present in some embodiments.

The processing device 210 may include memory, e.g., read only memory (ROM) and random-access memory (RAM), storing processor-executable instructions and one or more processors that execute the processor-executable instructions. In embodiments where the processing device 210 includes two or more processors, the processors may operate in a parallel or distributed manner. Processing device 210 may execute the operating system of the computerized device 110. Processing device 210 may include one or more modules executing programmed code or computerized processes or methods including executable steps. Illustrated modules may include a single physical device or functionality spanning multiple physical devices. In the illustrative embodiment, the processing device 210 also includes a test operation module 212, a data collection module 214, and an electrode analysis module 215, which are described in greater detail below.

The data input output device 230 is a device that is operable to take data gathered from sensors and devices throughout the vehicle and process the data into formats readily usable by processing device 210. Data input output device 230 is further operable to process output from processing device 210 and enable use of that output by other devices or control modules throughout the vehicle.

The communications device 220 may include a communications/data connection with a bus device configured to transfer data to different components of the system and may include one or more wireless transceivers for performing wireless communication.

The memory storage device 240 is a device that stores data generated or received by the computerized device 110. The memory storage device 240 may include, and is not limited to, a hard disc drive, an optical disc drive, and/or a flash memory drive.

The test operation module 212 includes programming to operate and control the disclosed method within the test device 10. The test operation module 212 may include programming to control voltages supplied to the anode 30 and the cathode 20. The test operation module 212 may include programming to open or close a circuit connected to the anode 30 and the cathode 20. The test operation module 212 may include programming to control a pressure within the test device 10 (for example, by controlling an air compressor attached to the test device 10). The test operation module 212 may include programming to control one or more temperature control devices 95 of FIG. 2.

The data collection module 214 includes programming to monitor outputs or data from various sensors within or used in coordination with the test device 10. The various sensors may include the infrared sensor device 90, the potential sensors 70A, 70B, and 70C, the temperature sensors 71A, 71B, and 71C, and the pressure sensor 72. These sensors are provided as non-limiting examples of sensors that may be utilized in coordination with the test device 10. Data collected from the various sensors may be time stamped or collected simultaneously. Temperature distribution and voltage potential distribution may be correlated and important to analysis of the electrode being analyzed. By recording a time associated with the sensor data or by collecting data simultaneously, the data generated may be useful to describe the time dependent correlation between temperature distribution and voltage potential distribution.

The electrode analysis module 215 includes programming to analyze one or more electrodes within the test device 10. The electrode analysis module 215 may include programming to generate a colorized map of the anode 30 or the cathode 20 based upon data from the infrared sensor device 90 or a plurality of the temperature sensors 71A, 71B, and 71C. The electrode analysis module 215 may include programming to calibrate the infrared sensor device 90 or adjust data from the infrared sensor device 90 based upon data collected from the temperature sensors 71A, 71B, and 71C. The electrode analysis module 215 may include programming to map or provide information about data from the potential sensors 70A, 70B, and 70C. The electrode analysis module 215 may include programming to correlate the collected temperature distribution data and the collected potential distribution data. The electrode analysis module 215 may include programming to identify a hottest location on an electrode and a lowest temperature location on an electrode. The electrode analysis module 215 may include programming to generate graphical outputs, such as describing temperature as a function of increasing time or potential as a function of increasing temperature. The electrode analysis module 215 may include a variety of programming and analyses, and the disclosure is not intended to be limited to the examples provided herein.

Computerized device 110 is provided as an exemplary computerized device capable of executing programmed code to accomplish the methods and processes described herein. A number of different embodiments of computerized device 110, devices attached thereto, and modules operable therein are envisioned, and the disclosure is not intended to be limited to examples provided herein.

Figure 5:
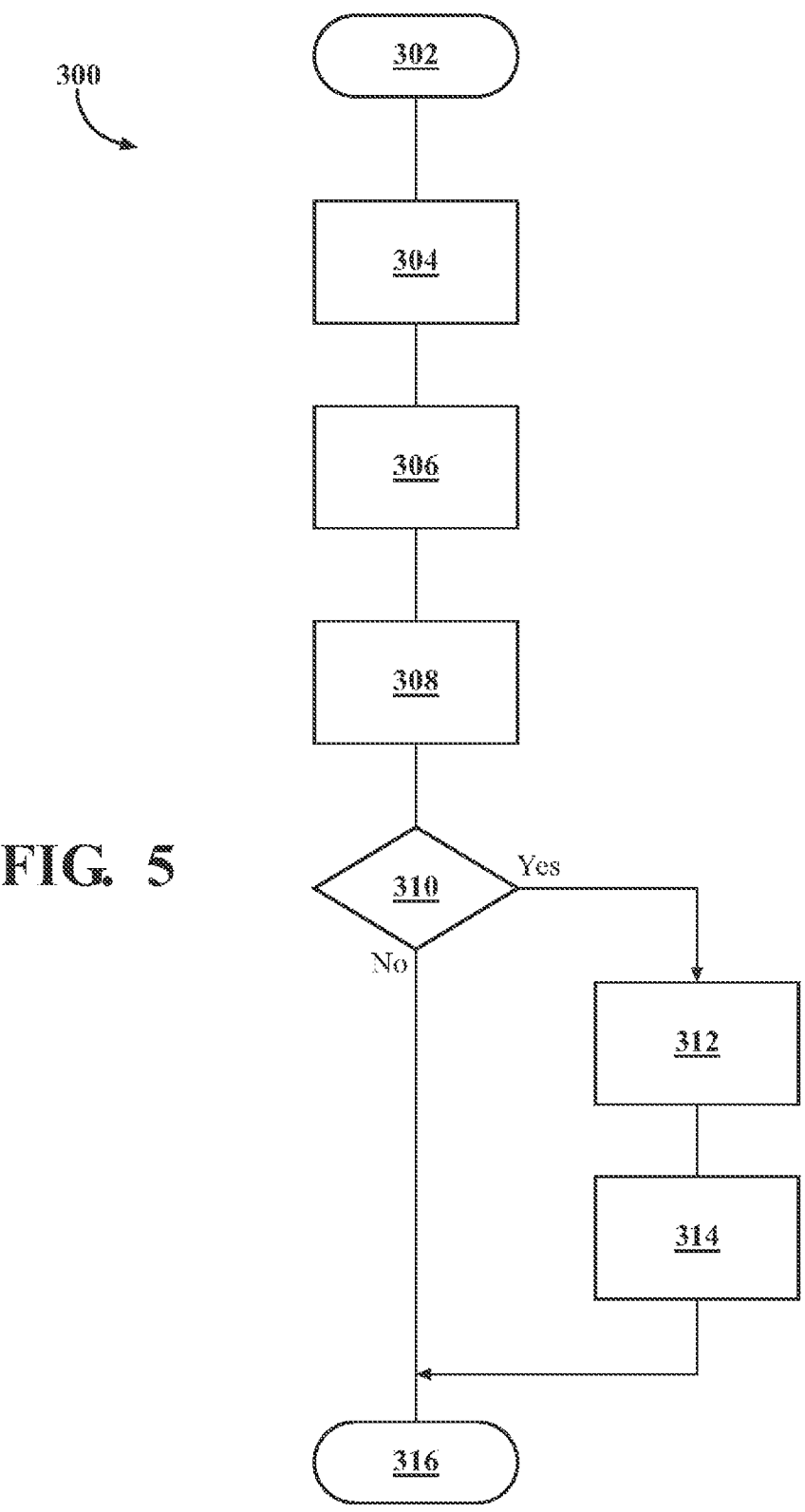
FIG. 5 is a flowchart illustrating a method for in-situ mapping of electrode potential and thermal distribution. in accordance with the present disclosure.

FIG. 5 is a flowchart illustrating a method 300 for in-situ mapping of electrode potential and thermal distribution. The method 300 is described to include use of the test device 10 and components illustrated therewith in FIGS. 1-3, although the physical components utilized with the method 300 may vary. The method 300 starts at step 302. At step 304, parameters for a test cycle to be operated within the test device 10 are entered by a user or loaded from a saved program, and prerequisite conditions to start the test cycle within the test device 10 such as temperature and pressure are controlled. At step 306, the test cycle is operated, conditions within the test device 10 including operation of the anode 30 and the cathode 20 are controlled to generate potential distribution and temperature distribution within the test device 10 useful to analyze one of the anode 30 and the cathode 20. At step 308, the data from the test cycle is collected and provided as an output to a user. The step 308 may include utilizing the test data to configure manufacture of an electrode, for example, selecting a location to deposit a relatively thick layer of lithium upon the electrode. At step 310, a determination is made whether a secondary analysis, for example, correlating simultaneously collected temperature distribution and potential distribution is to be performed. If the secondary analysis is to be performed, the method 300 advances to step 312. If the secondary analysis is not to be performed, the method 300 advances to step 316 where the method 300 ends.

At the step 312, the secondary analysis is performed. At the step 314, the results of the secondary analysis is provided as an output to the user. The step 314 may include utilizing the test data to configure manufacture of an electrode, for example, selecting a location to deposit a relatively thick layer of lithium upon the electrode. At step 316, the method 300 ends. The method 300 is provided as an example of a method useful to operate a test cycle within the test device 10. A number of additional or alternative method steps are envisioned, and the disclosure is not intended to be limited to the examples provided herein.

While the best modes for carrying out the disclosure have been described in detail, those familiar with the art to which this disclosure relates will recognize various alternative designs and embodiments for practicing the disclosure within the scope of the appended claims.

What is claimed is:

1. A system for in-situ mapping of electrode potential and thermal distribution, the system including:
    a test device, including:
      an anode;
      a cathode;
      a reference electrode;
      a separator disposed between the anode and the cathode; and
      a voltage potential sensor configured for monitoring a first voltage potential at a first position upon one of the anode or the cathode as compared to a second voltage potential of the reference electrode;
    an infrared sensor device configured for collecting data describing temperature variation across a surface of one of the anode or the cathode; and
    a computerized device including programming to:
      monitor data generated by the voltage potential sensor;
      monitor data generated by the infrared sensor device;
      control operation of a test cycle including controlling operation of the anode and the cathode through the test cycle; and
      analyze the monitored data generated by voltage potential sensor and the infrared sensor device during the test cycle to provide correlated voltage potential distribution data and temperature distribution data across the surface of the one of the anode and the cathode.

2. The system of claim 1, wherein the test device further includes an infrared transparent wall configured for enabling the infrared sensor device to collect the data describing the temperature variation.

3. The system of claim 2, wherein the infrared transparent wall is constructed with sapphire or calcium fluoride.

4. The system of claim 1, wherein the test device further includes at least one temperature sensor configured for monitoring a temperature at a second position upon one of the anode or the cathode and the at least one temperature sensor is configured for calibrating the infrared sensor device.

5. The system of claim 1, wherein the test device further includes:
    a plurality of voltage potential sensors configured for monitoring a voltage potential variation within one of the anode and the cathode; and
    a plurality of temperature sensors.

6. The system of claim 1, wherein the infrared sensor device is configured for generating a two-dimensional output describing the temperature variation.

7. The system of claim 6, wherein the two-dimensional output includes a spectral display providing a visual representation of the temperature variation.

8. The system of claim 1, wherein the test device further includes a pressure sensor providing data regarding a pressure within the test device.

9. The system of claim 1, wherein the reference electrode is located within the separator.

10. The system of claim 1, wherein the test device further includes a spring device useful to apply a compressive pressure upon the anode, the cathode, the reference electrode, and the separator.

11. The system of claim 1, further comprising a power source configured for providing a desired anode electrical charge to the anode and a desired cathode electrical charge to the cathode.

12. The system of claim 1, wherein the data generated by the voltage potential sensor and the data generated by the infrared sensor device are simultaneously collected.

13. A system for in-situ mapping of electrode potential and thermal distribution, the system including:
   a test device, including:
      an anode;
      a cathode;
      a reference electrode;
      a separator disposed between the anode and the cathode;
      a plurality of voltage potential sensors configured for monitoring a first voltage potential distribution within one of the anode or the cathode as compared to a second voltage potential of the reference electrode;
      a plurality of temperature sensors;
      a pressure sensor providing data regarding a pressure within the test device; and
      an infrared transparent wall; and
   an infrared sensor device configured for collecting data describing temperature variation across a surface of one of the anode or the cathode through the infrared transparent wall, wherein the plurality of temperature sensors are configured for calibrating the infrared sensor device; and
   a computerized device including programming to:
      monitor data generated by the plurality of voltage potential sensor;
      monitor data generated by the plurality of temperature sensors;
      monitor data generated by the pressure sensor;
      monitor data generated by the infrared sensor device;

control operation of a test cycle including controlling operation of the anode and the cathode through the test cycle; and
      analyze the monitored data generated by the plurality of voltage potential sensors, the plurality of temperature sensors, the pressure sensor, and the infrared sensor device during the test cycle to provide correlated voltage potential distribution data and temperature distribution data across the surface of the one of the anode and the cathode.

14. The system of claim 13, wherein the infrared sensor device is configured for generating a two-dimensional output describing the temperature variation.

15. The system of claim 14, wherein the two-dimensional output includes a spectral display providing a visual representation of the temperature variation.

16. A method for in-situ mapping of electrode potential and thermal distribution, the method including:
   operating a test device including an anode, a cathode, a separator, a reference electrode, and a plurality of voltage potential sensors disposed to provide data regarding voltage potential distribution within the anode or the cathode;
   operating an infrared sensor device to provide data regarding a temperature distribution across a surface of one of the anode or the cathode;
   operating a test cycle including controlling operation of the anode and the cathode to generate the voltage potential distribution and the temperature distribution within the test device;
   analyzing the data regarding the voltage potential distribution and the data regarding the temperature distribution collected during the test cycle; and
   configuring an electrode for manufacture based upon the analyzing.

17. The method of claim 16, wherein the test device further includes an infrared transparent wall configured for enabling the infrared sensor device to collect the data describing the temperature distribution.

18. The method of claim 17, wherein the infrared transparent wall is constructed with sapphire or calcium fluoride.

* * * * *